United States Patent [19]
Le

[11] Patent Number: 5,475,618
[45] Date of Patent: Dec. 12, 1995

[54] APPARATUS AND METHOD FOR MONITORING AND CONTROLLING AN ION IMPLANT DEVICE

[75] Inventor: Van Le, Austin, Tex.

[73] Assignee: Advanced Micro Devices, Sunnyvale, Calif.

[21] Appl. No.: 14,014

[22] Filed: Jan. 28, 1993

[51] Int. Cl.$^6$ .................................................. G01B 15/00
[52] U.S. Cl. ...................... 364/550; 364/551.01; 364/552
[58] Field of Search .............................. 364/550, 551.01, 364/552, 188, 189; 250/492.21, 492.22, 492.2, 370.01, 370.45; 340/649; 380/30; 341/100, 101, 176, 173, 175

[56] References Cited

U.S. PATENT DOCUMENTS

| | | | |
|---|---|---|---|
| 3,863,226 | 1/1975 | Ryburn | 341/100 |
| 4,447,804 | 5/1984 | Allen | 341/100 |
| 4,469,945 | 9/1984 | Hoeberechts et al. | 250/370 |
| 4,531,191 | 7/1985 | Koyama | 250/492.22 |
| 4,603,320 | 7/1986 | Farago | 341/101 |
| 4,728,930 | 3/1988 | Grote et al. | 341/101 |
| 4,743,806 | 5/1988 | Gyulai et al. | 250/492.21 |
| 4,748,668 | 5/1988 | Shamir et al. | 380/30 |
| 4,967,381 | 10/1990 | Lane et al. | 364/188 |
| 5,083,117 | 1/1992 | Holgaard | 340/649 |
| 5,091,655 | 2/1992 | Dykstra et al. | 250/492.2 |
| 5,132,545 | 7/1992 | Shono et al. | 250/492.21 |
| 5,144,142 | 9/1992 | Fueki et al. | 250/492.22 |
| 5,149,976 | 9/1992 | Sipma | 250/492.2 |
| 5,244,820 | 9/1993 | Kamata et al. | 250/492.2 |
| 5,281,827 | 1/1994 | Kawano et al. | 250/492.2 |

*Primary Examiner*—Ellis B. Ramirez
*Assistant Examiner*—Hal D. Wachsman
*Attorney, Agent, or Firm*—Kevin L. Daffer

[57] ABSTRACT

An improved ion implant device is provided having programmable and graphical user interface. The ion implant device can be accessed by a remote computer such as an IBM®-compatible PC/XT/AT personal computer to allow an operator to access, control and monitor the implant device from a remote location. Various control signals associated with implant operation can be changed or modified according to implant parameters stored within the computer. Each time a wafer lot is to be processed, the implant parameters can be quickly retrieved from the computer and read to the implant device with minimum operator error. Likewise, various implant parameters and/or implanter settings can be written to the computer and stored within the computer's memory. The computer can be easily interfaced or retrofitted to existing implant devices with only a minimum amount of necessary software code and associated hardware.

6 Claims, 6 Drawing Sheets

Microfiche Appendix Included
(1 Microfiche, 44 Pages)

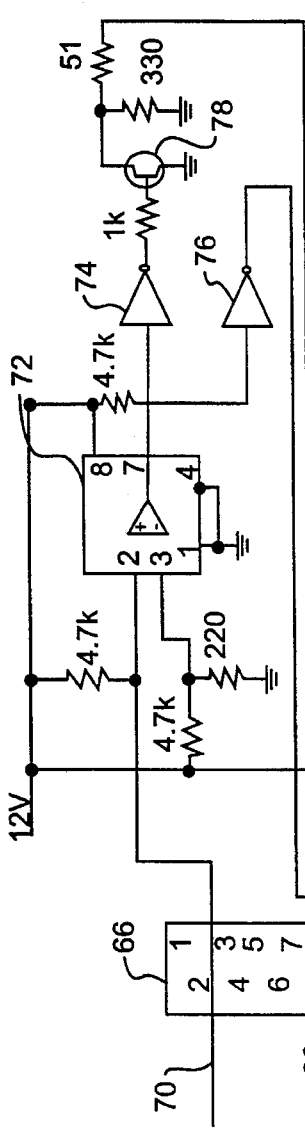
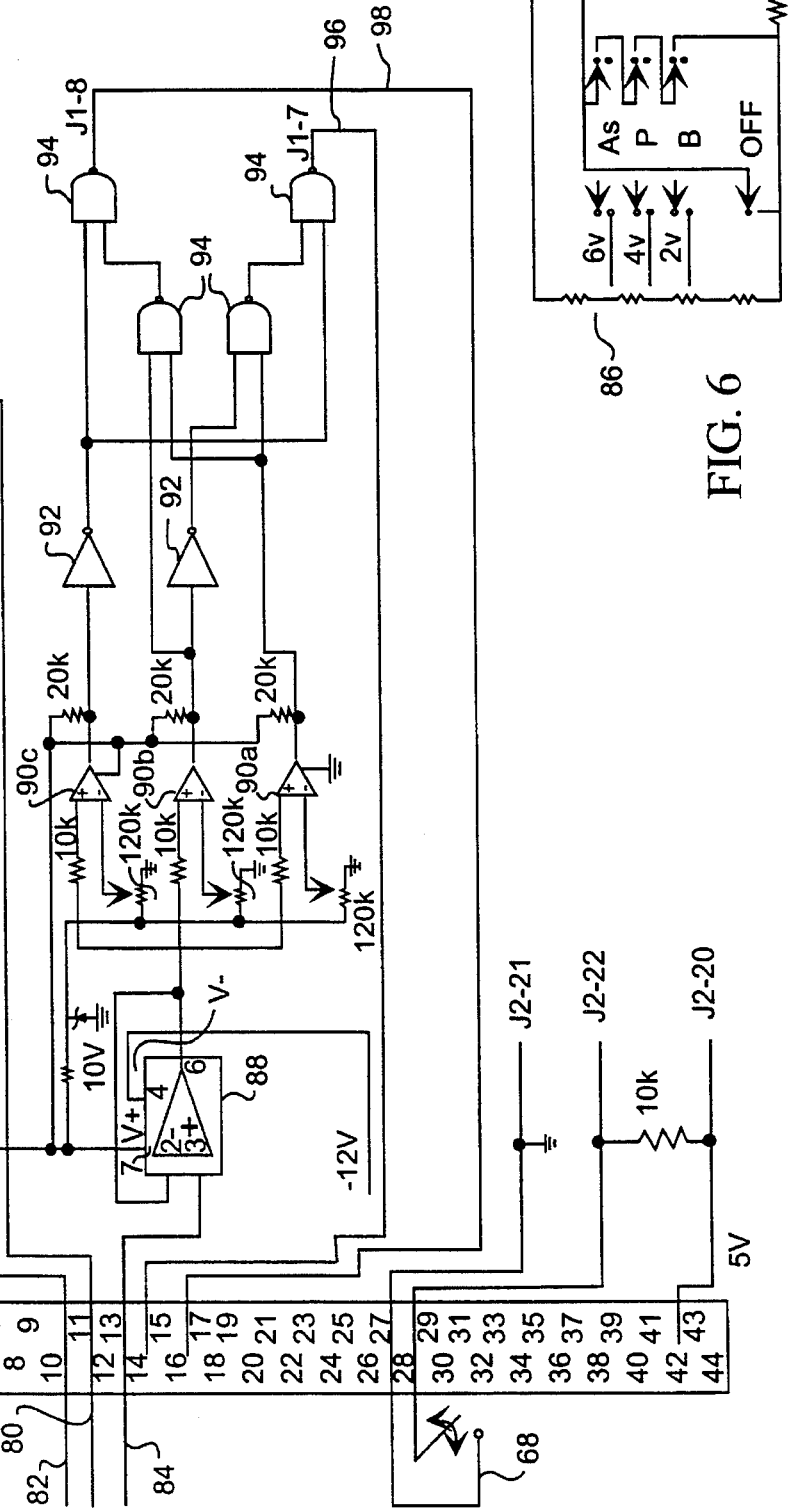
FIG. 5
FIG. 6

APPARATUS AND METHOD FOR MONITORING AND CONTROLLING AN ION IMPLANT DEVICE

BACKGROUND OF THE INVENTION

Incorporated herein is a computer program listing microfiche appendix of source code used to access, modify and monitor control signals sent between a host computer and a peripheral device such as an ion implanter, according to the present invention. Copyright, 1993, Advanced Micro Devices, Inc. A portion of the disclosure of this patent document contains material which is subject to copyright protection. The copyright owner has no objection to the facsimile reproduction by anyone of the "microfiche appendix", as it appears in the Patent and Trademark Office file or records, but otherwise reserves all copyright rights whatsoever.

1. Field of the Invention

This invention relates to semiconductor manufacturing and more particular to an ion implant device having programmable and graphical user interface.

2. Background of the Relevant Art

Ion implantation devices, or ion implanters, are well known. A primary function of an ion implanter is to provide an ion beam with sufficient energy to penetrate a solid surface. Ion implanters are commonly used in the semiconductor industry to introduce impurities or dopants into the solid semiconductor surface. The depth in which ions are introduced into the semiconductor increases as acceleration voltage of the implanter increases. Moreover, the total number of ions injected is proportional to the beam current and implant time of the implanter. For singly charged ions, each ion has a charge q of one electron, which relates to $1.6 \times 10^{-19}$ coulombs. Thus, if $\phi$ ions per $cm^2$ (or dose) are to implanted for a wafer of area A $cm^2$, $qA\phi$ coulombs are required. If the implant is to be accomplished in t seconds, $qA\phi/t$ coulombs per second are needed. Since current in amperes is coulombs per second, the beam current I can be expressed as follows:

$$I \text{ (in } mA\text{)} = \frac{1.6 \times 10^{-19} A\phi}{t}$$

"Implant parameters" as defined herein is any setting or resulting implant value which can be achieved by an ion implant device. Implant parameters can be measured directly by the implanter or indirectly from the resultant semiconductor surface. Implant parameters include ion beam current, ion implant dose, ion source energy, ion acceleration voltage (or implant depth), etc. Depending upon the desired application, implant parameters can vary in order to achieve a necessary outcome. For example, MOS threshold adjust does not require as large an implant dose as bipolar bases or CMOS wells. Moreover, resistors, while requiring a larger implant dose than MOS threshold adjust, does not require as large a dose as embedded oxide and nitride areas. Not only does implant dose vary depending upon the target application, but implant depth (range) may also vary depending upon the application. Still further, impurity ions of different species have dissimilar atomic mass. Fluctuation in atomic mass (i.e., selection of ionic doping species) requires a corresponding change in implant parameters. Even still further, modern lithography processing often utilizes shallow junction diffusion thereby requiring close tolerances in implant depth.

Knowing the importance in maintaining fairly precise implant parameters, it is necessary that the parameters be closely monitored and that the parameters be "set" into the implanter with minimum error. Conventional implanters often utilize a control panel configured within or upon the implanter housing. The control panel employs a series of switches and light emitting diodes (LEDs). The switches allow the operator to make various parameter setting upon the implanter. LEDs indicate to the operator that the settings have been made. For example, a switch or dial placed upon the implanter can allow the operator to adjust beam current in milliamperes. The resulting LED readout will indicate and hopefully verify the amperes magnitude presently selected.

Each time the implanter processes a wafer lot of dissimilar technology from the previous lot, the implant parameters must be changed. For example, a dynamic random access memory (DRAM) wafer lot utilizing shallow junction depths and possible threshold adjust requires change in implant parameters before an analog, bipolar wafer lot of deeper junction depths is processed. Change in implant parameter between wafer lots can easily lend itself to operator error. Further, frequent verification of implanter settings is required in order to ensure proper operation. It may be necessary to actuate numerous switches and dials before the subsequent wafer lot is loaded. The operator may inadvertently fail to make one or more of the necessary changes or may fail to check or monitor the implanter to ensure the implanter has correctly made the change. The switches or LEDs may sometimes malfunction causing the operator to sense that a change was made; however, examination of the wafer may indicate that the change was not made or was made out of specification.

SUMMARY OF THE INVENTION

The problems outlined above are in large part solved by the implant device having programmable and graphical user interface of the present invention. That is, the implant device hereof is programmable to read, store and write implant parameters transmitted between the implanter and a remote computer. A set of implant parameters corresponding to a specific technology can be stored within the computer and written to the implanter by the user. User interface can be simplified to retrieve necessary parameters for a specific technology without requiring the user to memorize each of those parameters. The user need only input a write command for the target technology, and the computer automatically loads the implanter with the necessary parameters. The operator need not actuate numerous switches and dials which would add to the adjustment complexity and the possibility of error. Furthermore, the computer automatically monitors the parameters and each wafer within the processed wafer lot to provide automatic tracking according to wafer number and wafer lot number. Not only can the programmable ion implanter quickly and easily change parameters between lots, but it can achieve the changes with less opportunity for operator error. Implant parameters can appear upon the computer CRT to provide assurance that the changes were correctly made, and that they were made in accordance with the desired specification. The implant parameters are tagged along with the wafer number and wafer lot number to allow the operator to track wafer processing skews and their effect upon yields.

Broadly speaking, the present invention contemplates an apparatus for controlling and monitoring an ion implant device. The apparatus includes a plurality of control signals sent between the ion implant device and a user control panel. A control card is connected within the implant device and is adapted to receive control signals. An interface network connected to the control card allows for level shifting, noise isolating and serial accessing of the control signals which can then be read, stored and written into and from a computer coupled to the interface network. The computer can be placed at a remote location from the ion implant device and can be retrofitted directly into existing control hardware associated with the device.

The present invention further contemplates retrofittability of an ion implant device which is previously incapable of programmable user interface with an off-the-shelf personal computer. The retrofitted device allows a user to interface the ion implanter from a remote location such as a personal computer terminal or modem. Accordingly, the operator can access the implanter without his or her physical presence at the implanter location. As such, each implanter can have associated cabling network routed to a central command location where skilled operators or engineers can stipulate the monitor and control of one or more implanters simultaneously. Minimization of operators entering and exiting clean room processing areas is advantageous in maintaining lower particle contamination. Furthermore, remote access and control of the implanter allows skilled operators such as process engineers the convenience and capability of controlling implanters from the engineer's desk.

The present invention still further contemplates an apparatus for controlling and monitoring a plurality of control signals sent between the ion implant device and the computer. The control signals include signals for quantifying beam current, ion implant dose and ion source energy within the ion implant device. Control signals further comprise signals for tracking wafers and wafer lot numbers processed by the implanter. Control signals still further comprise signals for indicating ion beam on, automatic beam control on, ion implant chamber ready and cooling system on. As such, control signals include any implant parameter associated with ion implant processing as well as signals which aid the operator in tracking wafer processing skews and their effect upon yields for designated wafer numbers and wafer lot numbers stored within the computer. Accordingly, the operator can produce statistical graphs of wafer yields as a function of implant parameter skews. Graphical interface can provide a more useful and more easily understood relationship between implant parameter skews and wafer yield.

The present invention still further contemplates an apparatus for writing control signals from an ion implant device to a computer. The writing apparatus includes a plurality of control signals sent between an ion implant device and user control panel configured upon the device. A control card, connected within the implant device, is adapted to receive the control signals in parallel and deliver in series the signals to an input port. An interface network is connected between the control panel and the control card to receive the control signals from the control panel and from the input port. A computer is included having a storage media capable of writing the control signals upon address lines connected between the computer and the interface network. The storage media includes a set of addressable instructions responsive to the control signals. Control signals, being written from the ion implanter to the storage media, allows instructions to be addressed and transmitted (or read) back to the implanter to change or monitor one or more implant parameters or implanter operations (switch or LED conditions).

The present invention still further contemplates an apparatus for reading control signals to an ion implant device from a computer storage media. The reading apparatus includes a plurality of conductive paths arranged between an ion implant device and a user control panel configured upon the implant device. A plurality of shift registers are connected to one end of said conductive paths to receive serially shifted control signals from an output port and present the control signals in parallel through said conductive paths. An interface network is connected to the control panel and is connected to the output port to receive a plurality of control signals from a computer and into the control panel and output port. The computer, having a storage media, is capable of reading the control signals from the media and placing the signals upon data lines connected between the computer and the interface network. The storage media comprises a set of addressable instructions corresponding to the control signals.

BRIEF DESCRIPTION OF THE DRAWINGS

Other objects and advantages of the invention will become apparent upon reading the following detailed description and upon reference to accompanying drawings in which:

FIG. 5 is a block diagram of a vector card placed within an interface network according to the present invention;

FIG. 6 is a circuit diagram of a gas select switch associated with an ion implanter according to the present invention;

Figure 1:
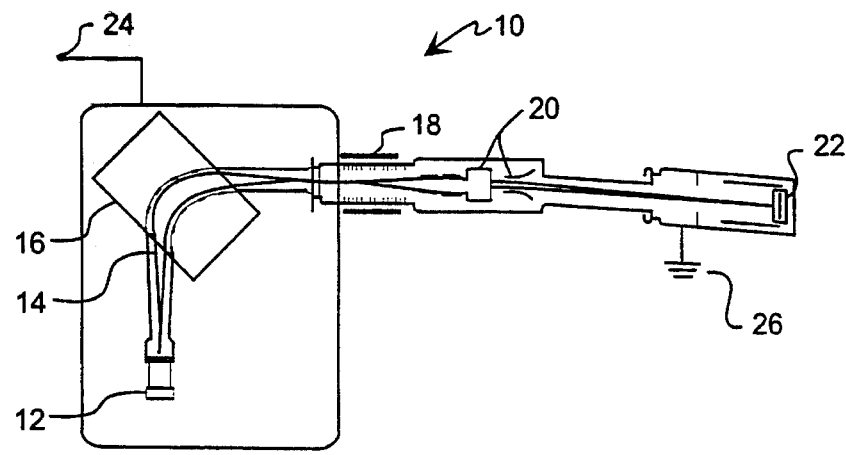
FIG. 1 is a plan view of an ion implanter and associated beam path according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates several major elements of an ion implant device or ion implanter 10. Implanter 10 includes an ion source 12 of appropriate molecular species and converts the species to ions. Species includes any type of impurity substance which can be used as a dopant in semiconductor manufacture. Common impurities include boron, phosphine and arsine. Ions are accelerated from source 12 along path 14 as shown. Accelerated ions enter a mass analyzer 16 for ion selection, whereby the exit beam of desired implant ions is chosen based on the charge-to-mass ratio of the ions. Analyzer 16 is generally sensitive enough to discriminate against adjacent mass numbers. The ions are then given a final acceleration through acceleration tube 18, after which the ion beam will be slightly electrostatically deflected via horizontal and vertical electrodes or plates 20 to separate desired ions from neutral atoms that may have formed. The beam is then scanned over target wafer surface 22 either electrostatically, or mechanically, or by a combination of the two. In addition, an electron source (not shown) may be placed near the wafers to "flood" the surface with electrons and prevent a charge buildup upon the insulating surfaces (e.g., silicon dioxide or silicon nitride). Acceleration of ions from source 12 and into the wafer surface is achieved by an electrostatic potential between high voltage terminal 24 and implanter machine ground 26.

Figure 2:
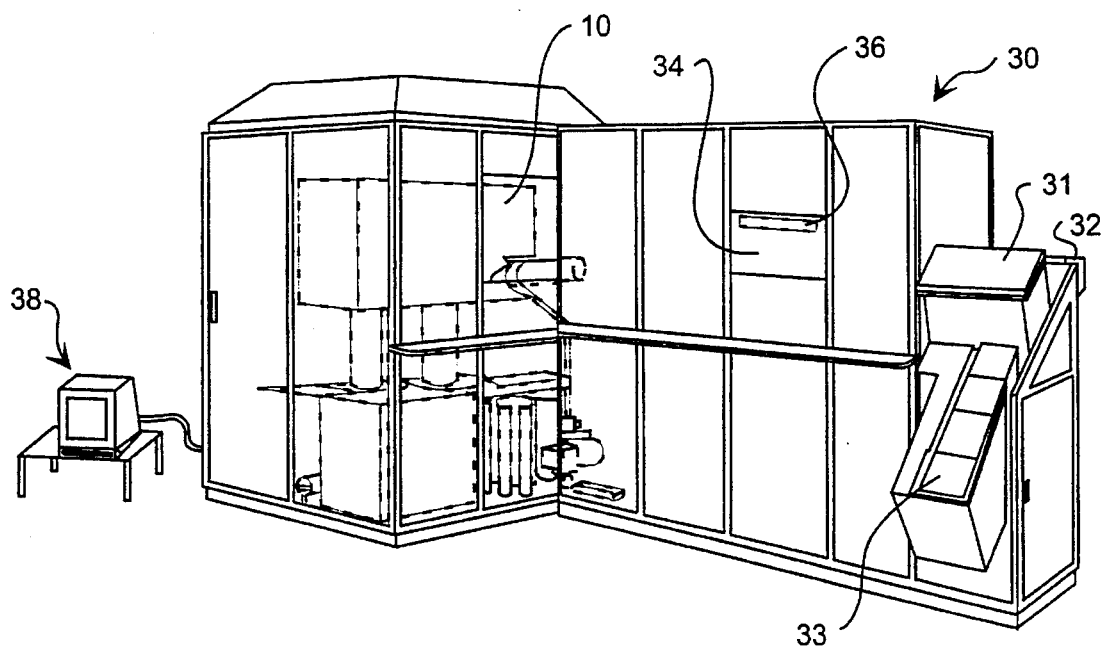
FIG. 2 is a perspective view of an ion implanter with wafer load mechanism and remote computer interface according to the present invention.

Turning now to FIG. 2, implanter 10 is shown by dotted line within a surrounding cabinet and wafer load mechanism 30 to form an implanter machine 30. Various types of mechanisms or machines 30 can be used to receive wafers, implant the wafers and then expel the wafers within a single unibody structure as illustrated in FIG. 2. An exemplary implanter machine 30 which achieves those function may be purchased from Eaton Corporation, Ion Implantation Division, Austin, Tex., as model no. 200 series. Generally speaking, wafers are loaded into process chamber 31 from load station 32. The wafers are then implanted and moved to unload station 33. Mechanism 30 includes a display/control panel or user control panel 34 placed on or near the outer surface of machine 30. User control panel 34 includes various switches, dial and LEDs indicative of machine operation. Certain controls such as run batch, run wafer, stop processing, power reset, chamber open, chamber pump on/off, beam energy, beam current, gas type, etc., are all associated with control panel 34 and are well known in ion implant equipment design.

One or more conductive paths are formed between control panel 34 and a plurality of control cards 36 contained within machine 30. Control cards 36 provide an interface location for accessing electronic control signals sent between implanter 10 and control panel 34. Control signals can also be sent as implant operation signals between implanter 10 and mechanical controls, monitors and motors associated with implanter 10 and load station 32. Thus, control cards 36, which will be described in detail below, provide all interface control locations of any and all control signals transmitted within machine 30.

Connected to control cards 36 is a computer 38. Computer 38 acts as a host device, with machine 30 being a peripheral unit. Host computer 38 and machine 30 may be in close physical proximity, as in the case of a local terminal at the implanter sight or they may be physically remote, as in the case of a dial-up terminal used to communicate with the implanter. It is to be appreciated that remote operation can occur through a remote modem link, and that computer 38 is preferably an off-the-shelf personal computer having a 386- or 486-based microprocessor architecture with at least 2 Meg internal RAM and a hard drive storage capacity. Computer 38 can include a laptop computer with an RS232 port as would be necessary for dial-up communication.

Figure 3:
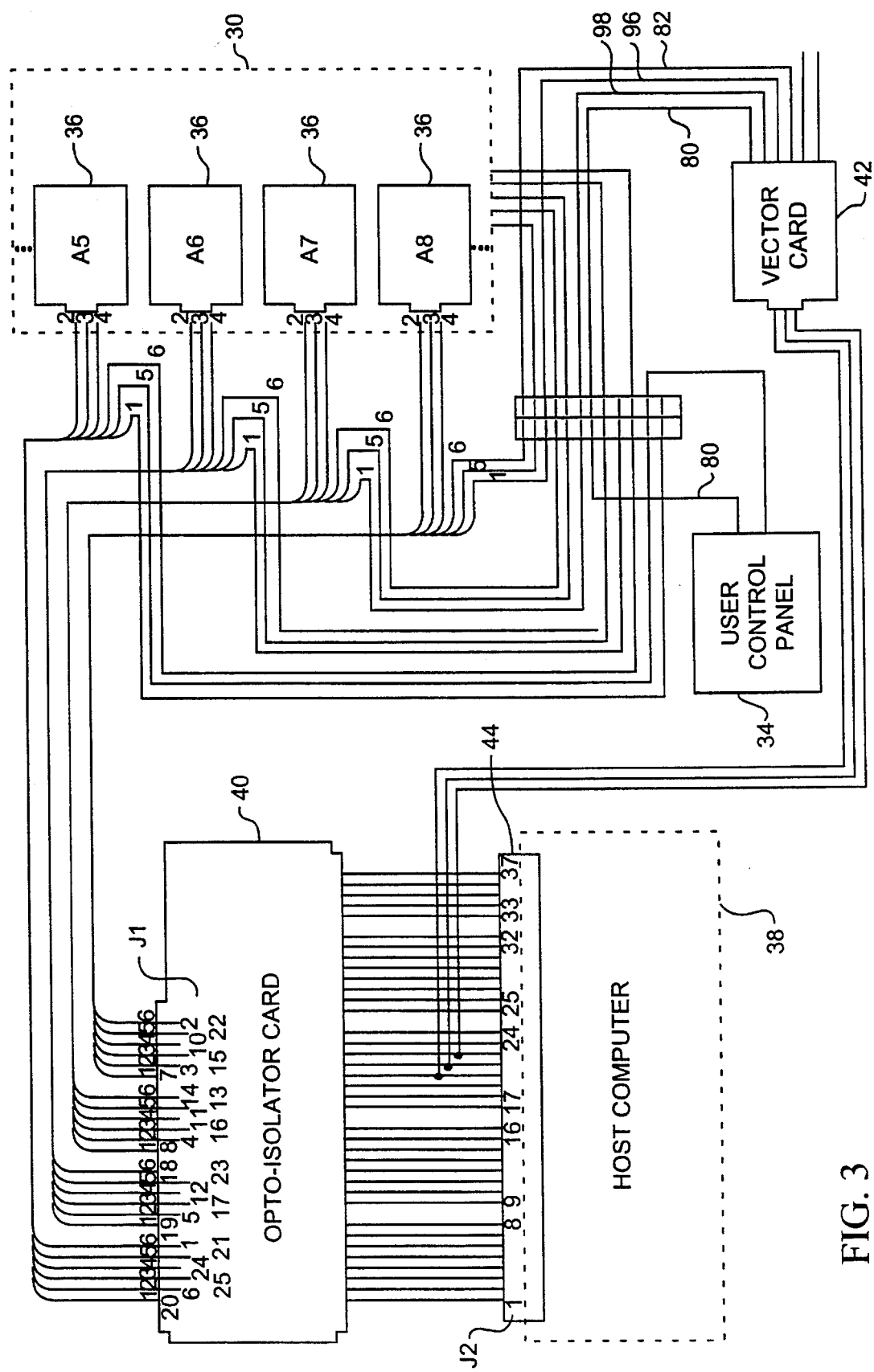
FIG. 3 is a block diagram of an ion implanter control schematic with remote computer interface according to the present invention.

Referring to FIG. 3, a block diagram of an ion implanter control schematic with remote computer interface is shown. Implanter machine 30 cabinet houses one or more control cards 36. Exemplary control cards for an Eaton Corporation implanter, series 200 include cards designated as "A rack" cards defined in the operating manual for the series 200 Kasper implanter. As with most ion implanters, series 200 implanter includes A-cards or interface control cards 36 which contain conductive paths for receiving control signals to and from various destinations. As defined herein, "control signals" include any signal relating to the operation of ion implantation including implanter 10 and machine 30 functionality. The control signals can originate from user control panel 34 or implanter 10, whereby it is understood that any and all such signals traverse conductors placed upon one or more of cards 36. Various control signals include signals which signify implant parameters such as beam current, ion implant dose, ion source energy, etc. Moreover, control signals include signals for tracking wafers and wafer lot numbers processed by the implanter. Still further, control signals include signals for indicating ion implanter operation such as ion beam on, automatic beam control on, ion implant chamber ready, cooling system on, etc. As will be described in detail, and shown in FIG. 4, an exemplary control card 36 is provided with a plurality of conductors for receiving specific control signals which originate from control panel 34 and/or computer 38.

Figure 7:
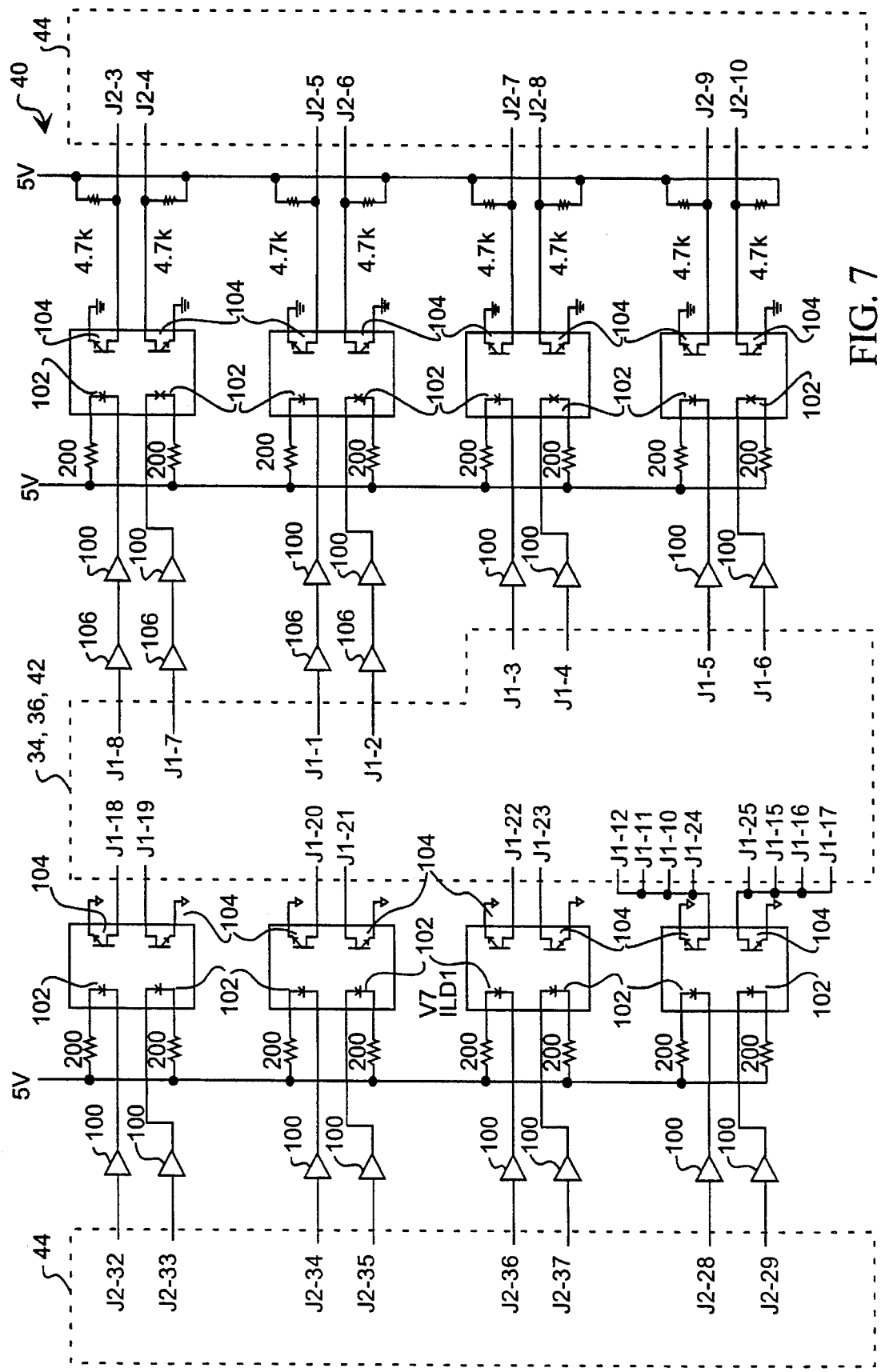
FIG. 7 is a circuit diagram of an opto-isolator card placed within an interface network according to the present invention.

Control signals can be serially fed into and out of each control card 36. For example, control signals can be sent and received on pin 2 of each control card 36. There are four cables that are connected from an opto-isolator card 40 to control cards 36. Each cable has six conductive wires labeled 1 through 6. For each control card 36, pin 2 is connected to conductive wire 2, and so on for pins 3 and 4. Opto-isolator card 40 will be described in detail below, and is shown in FIG. 7. Card 40 functions to isolate ground signal of machine 30 from the ground signal of computer 38. Card 40 also converts CMOS level signals to TTL (or bipolar) level signals. TTL levels being present between host computer 38 and card 40, while CMOS levels are present between card 40 and machine 30. As illustrated, four sets of six input conductors are used to connect card 40 to machine 30, to user control panel 34, and to vector card 42. Each set of conductors can be arranged in a ribbon cable configuration of common design to allow card 40 to be remotely attached to machine 30. Each conductor of the ribbon cable conductors is attached to a socket labeled as J1, wherein pin-out for socket J1 includes 25 receptacles labeled herein as J1-1 to J1-25 (J1-9 being omitted in the exemplary schematic shown in FIG. 3). Opto-isolator card 40 is adapted to receive 37 conductors from digital input/output (DIO) card 44. An exemplary DIO card can be purchased from Keithley Metrabyte/Asyst/Dac Corporation, Taunton, Mass., model no. PIO-12.

DIO card 44 includes twenty four TTL/DTL compatible digital I/O lines, interrupt input and enable lines, and external connections to an IBM®-compatible personal computer bus line. Twenty four digital I/O lines are provided through an Intel Corporation, Santa Clara, Calif., programmable peripheral interface unit model no. 8255. Other peripheral interface unit can also be used provided the overall feature of DIO card 44 remains, namely, DIO 44 has unidirectional, bidirectional, strobed I/O with interrupt handling capability allowing direct interface to a wide range of peripherals and can plug directly into an IBM®-compatible PC/XT/AT bus. The programmable peripheral interface is programmed via source code contained herein and referenced as "microfiche appendix". The source code program contains a control byte of 10001010. Having received such a control byte the programmable peripheral interface is software configured such that port A (PA) is an output port, port B (PB) is an input port, and port C (PC) is an input and output port. PC0–3 bits comprise output bits and PC4–7 are input bits. Pins J2-3 through J2-10 are reserved for PB input from the peripheral (i.e., opto-isolator card 40 and related interface network) to computer 38. Pins J2-22 through J2-29 are reserved for PC input/output between the peripheral and computer. Pins J2-30 through J2-37 are reserved for PA output from computer 38 to the peripheral. Pin J2-20 represents +5 v, and pin J2-21 is digital ground. As shown, pins J2-20 and J2-21 are connected to vector card 42. Further, pin J2-22 is connected to the output of vector card 42. DIO card 44 plugs directly into a standard 37 pin D-type male connector which projects from the rear panel of host computer 38 such that DIO card and connected interconnect network appears to the computer as merely a standard peripheral unit.

By using an opto-isolator card and DIO card, computer 38 interfaces directly with control signals transmitted within control cards 36. As such, control signals can address data bus signals or can be stored within computer 38 via data bus signals. Similar to any personal computer communication capability, computer 38 can communicate to its periphery using any standard transmission link including telephone lines or air waves. A vector card 42 can be placed within machine 30 or remote from machine 30 depending upon application and space constraints. If placed within machine. 30, vector card 42 can be inserted as part of the board assembly adjacent to the control cards, for example, as card 24 arranged adjacent control cards A5–A8 of an Eaton Corp. implanter model 200 series. Vector card 42 will be described below, and is preferably used to interface control signals sent to and from control cards 36, control panel 34 and DIO card 44. Vector card 42 provides decoding and encoding function necessary for digital/analog interface between analog switches and meters and digital processing.

Figure 4:
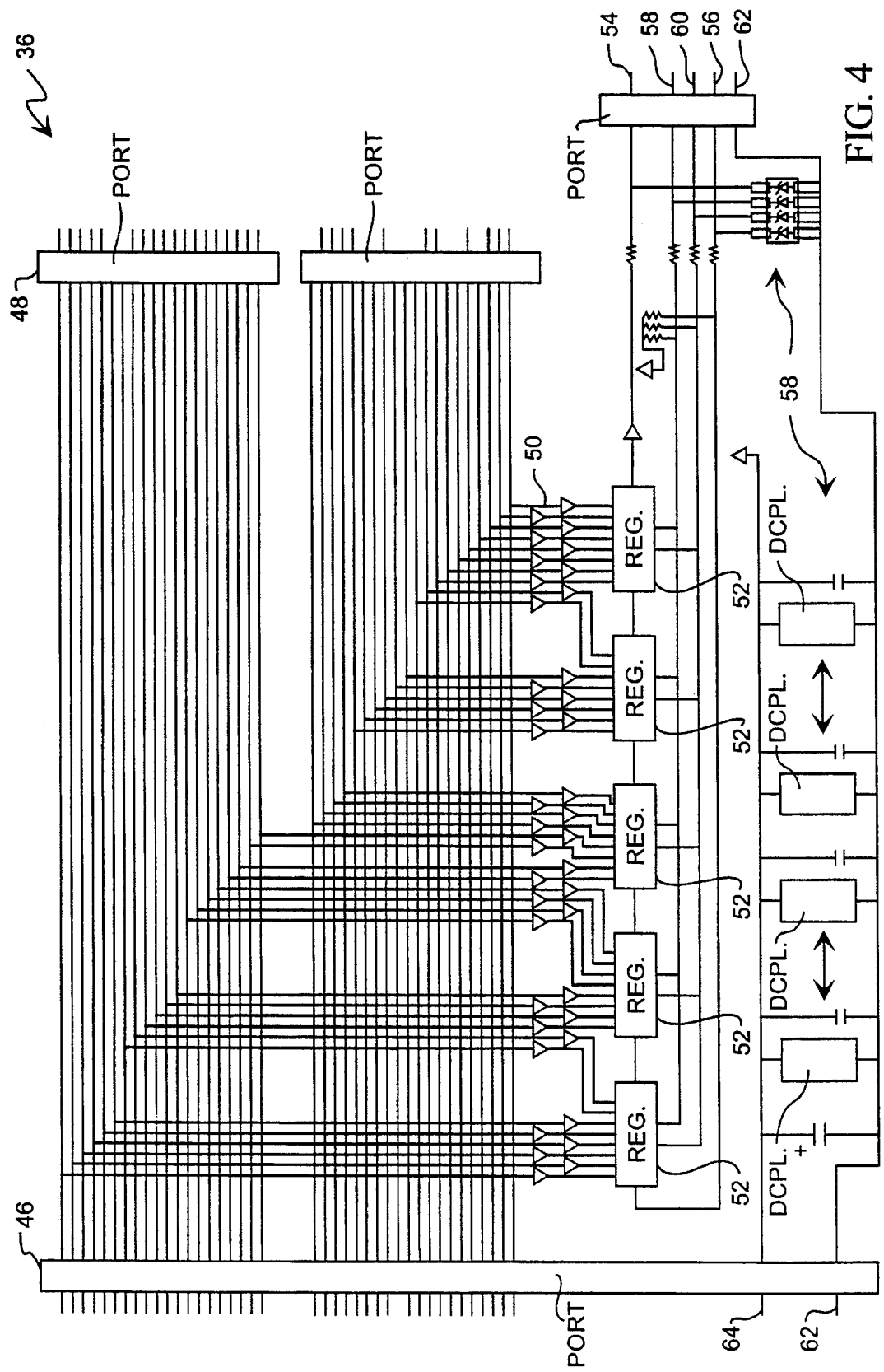
FIG. 4 is a block diagram of a control card schematic associated with an ion implanter according to the present invention.

Referring now to FIG. 4, an exemplary control card 36 is illustrated. Card 36 includes two ports 46 and 48 for receiving ribbon cable connection thereto. A plurality of conductors are arranged between ports 46 and 48, each conductor is routed in parallel to a plurality of non-inverting buffers 50. In particular, six non-inverting buffers can be contained within a standard CMOS device, a suitable device part no. being 4050 manufactured by Motorola Semiconductor, Inc. Each buffer can be used as a normal CMOS buffer or as a CMOS/TTL level shifter. Each buffer can drive up to standard TTL inputs. Placed at the parallel output of buffers 50 are serial output-connected eight bit static shift registers 52. A suitable eight bit shift register can be purchased as part no. 4021 from Motorola Semiconductor, Inc. Part no. 4021 is a standard CMOS device, and is an eight-bit serial shift register. Each register has eight parallel data lines (P0–P7), one load line (PL), one clock line (CP), one serial data line (DS), and three output lines (O5–O7). Each time PL goes low to high, P0–P7 are loaded into the register. Each time CP goes low to high, data is shifted by one to the right, as follows: D7=D6, D6=D5, . . . , D1=D0, D0=DS, O7=D7, O6=D6, O5=D5, where Dx is the xth data bit in the register. In the exemplary embodiment described herein, only O7 is used as the serial output bit. Registers 52 receive parallel input which are then serially shifted to the right by a clock signal connected to each register. After approximately forty clock signals, the entire contents of the forty conductors are shifted to Sin output 54. Sin corresponds to one of the outputs denoted as pin 2, 3 or 4 shown in FIG. 3. Sin is transmitted to opto-isolator card 40 for input to computer 38. Sin represents control signals sent from machine 30 to computer 38 to allow the computer to receive information about machine status and/or operation. Conversely, pin 56 can receive Sout signals from computer 38, which are then serially read into registers 52 and parallel output to the forty conductors. Implanter machine 30 then subsequently reads the Sout signals and makes appropriate adjustments to implanter operation based upon computer output. It is appreciated that each buffer 50 can be reverse coupled to provide an input or output structure which allows bidirectional signals sent between the conductors and shift registers. Optional decoupling or spike protection circuits 58 can be used to prevent noise upon Sin 54, Sout 56, clock 58, load 60, machine ground 62 and machine power supply 64.

Referring now to FIG. 5, vector card 42 is illustrated. Vector card 42 comprises three independent subcircuits. The first subcircuit receives a stop lamp signal 70 from pin 2, which originates from pin 37 of A6 control card 36. First subcircuit functions to reproduce the same input signal at the output through pin 11, and to produce a digital signal through pin 10 that is sensed by computer 38. From this digital signal, computer 38 can determine whether the machine is in a halt state or in a run state. The second subcircuit receives the gas select signal as input through pin 13. This signal originates from the gas select circuit in the source control panel. It can have one of four present voltages, represented by two bits. One bit, gas 1, is connected to pin 14, while the other bit, gas 2, is connected to pin 16. The third subcircuit receives two wires from a contact switch as input through pins 27 and 28. This switch is located at the chamber (end station). The switch is closed when the implant angle is 0°. The switch is open when the implant angle is 7°. The third subcircuit consists of a pull-up resistor, and as the switch is closed (0° implant), the resistor is pulled low to produce a logic 0 as output. As the switch is opened (7° implant), the resistor is pulled high to produce a logic 1 as output. This output is connected to pin J2-22 of the ribbon cable and is called "Tilt" signal.

Vector card 42 receives computer ground from pin J2-21, as shown in FIG. 3. Also, computer power supply is provided via pin J2-20. Ground or common at pin J2-21 is routed to pin 27, while power from pin J2-20 is routed to pin 42 of a standard socket connector 66. A tilt signal can be sent to pin J2-22 from computer 38 and, depending upon switch 68 position, is either a logic one or a logic zero at pin 28. Tilt signal indicates whether or not the computer decides if the wafer angle loaded within station 32 is to be 0° from vertical or 7° from vertical (i.e., 0° indicating the wafer planar surface is parallel to vertical). Depending upon the angle of beam path 14 as decided by the deflection from plates 20, the angle can either be selectively set at 0° or 7° for proper ion implant. If switch 68 is closed, then essentially ground voltage is placed on pin 28 indicating, e.g., 0° tilt angle. Conversely, if switch 68 is open, then a logic one is sent to pin 28 indicating, e.g., 7° tilt. Accordingly, computer 38 provides the necessary control signal to indicate the tilt angle. Vector card 42 writes back to computer 38 indicating machine 30 has been properly adjusted and the necessary tilt angle has been achieved.

Another control signal, including for example stop lamp signal 70, is placed on socket connector 66 at pin 2. Stop lamp signal 70 derives from a stop process switch placed upon user control panel 34. Activating the switch causes discontinuance of implant process and a corresponding high level signal is sent through control cards 36 and then to pin 2 of connector 66. A high level signal is sent to a non-inverting input of a comparator 72, where the output of comparator 72 is sent to inverters 74 and 76. The output of inverter 74 is sent to TTL transistor 78. A low level signal at the output of inverter 76 indicates the machine is off and that stop lamp 70 is lit. Conversely, a high level output from comparator 76 indicates machine 30 is on and that stop lamp 70 is not lit. Output from inverter 76 is fed to pin 10, and output from pin 10 can be transmitted back to opto-isolator card 40 and computer 38 as shown in FIG. 3. Comparator 72 can be purchased from National Semiconductor Corp., part number LM311H having pin-out numbers as indicated. A high level or logic one output from collector terminal of transistor 78 indicates stop lamp 70 is lit which is then fed back to pin 11 of socket connector 66. Output from transistor 78, denoted as reference numeral 80, can be sent back to user control panel 34. Likewise, output from inverter 76, denoted as reference numeral 82, can be sent back to computer 38 via ribbon cable and opto-isolator card 40. Accordingly, computer 38 can control and monitor stop and start of machine 30.

A 0 volt, 2 volt, 4 volt or 6 volt signal can be sent along conductor 84 and placed upon pin 13 of socket 66 as shown in FIGS. 5 and 6. The selected voltage output is achieved by a gas select switch 86 as shown in FIG. 6. Switch 86, configured upon panel 34, or possibly software controlled within computer 38, provides 0 v, 2 v, 4 v or 6 v input depending upon whether no gas, boron gas, phosphine gas, or arsine gas, respectively, is selected. If, for example, boron is selected, then 2 v will be sent on conductor 84 to the non-inverting input of operational amplifier 88. An exemplary amplifier can be obtained from Motorola Semiconductor, part no. 741. Likewise, if phosphine is selected, then 4 v will be sent on conductor 84; and, if arsine is selected, then 6 v will be sent along conductor 84. Logic provided by comparators 90, inverters 92 and nand gates 94 present either a relatively high voltage state or a relatively low voltage state to pins 14 and 16, or pins J1-8 and J1-7, respectively. Reference voltage of comparator 90a is 1 v, reference voltage of comparator 90b is 3 v and reference voltage of comparator 90c is 5 v. Variable reference voltage is used to allow detection of 2 v, 4 v and 6 v input from operation amplifier 88. For example, if no gas is selected, then 0 v will appear on pins J1-7 and J1-8. If boron is selected, then 2 v will present a logic one at J1-7 and a logic zero at J1-8. If phosphine is selected, then a 4 v input will present a logic zero at J1-7 and a logic one at J1-8. Finally, if arsine is selected, then a 5 v input will present a logic one at both J1-7 and J1-8. The corresponding logic levels are sent on pins J1-7 and J1-8 as denoted by reference numerals 96 and 98, respectively. Computer 38 can therefore read the gas being selected by control panel 34. Additionally, or alternatively, computer 38 can read and write the gas being selected.

Turning now to FIG. 7, an opto-isolator card 40 is illustrated. Card 40 provides input for certain control signals and output for other. Specifically, card 40 provides input to computer 38 for control signals sent on pins J2-3 through J2-10. Card 40 also provides output from computer 38 for control signals sent on pins J2-28, J2-29 and J2-32 through J2-37. Given familiarity with DIO card 44, PB input port comprises pins J2-3 through J2-10 thereby making it apparent that the computer receives input from control cards 38, control panel 34 and vector card 42 via conductors connected to these pins. Likewise, PA output port and PC0-3 output port provide connection to conductors J2-28 and J2-29 (PC1 and PC2) and J2-32 through J2-37 (PA0 through PA5) for receiving output signals from computer 38 through DIO card 44. PC7 port input is provided to allow input of tilt angle demonstrated on pin J2-22 from vector card (see FIG. 7).

Opto-isolator card 40 includes a plurality of open collector transistors 100. A suitable transistor can be purchased from Motorola Semiconductor, part number 7407. Output from transistors 100 provide sinking current (if activated) through photodiodes 102. If activated, diode 102 provides optical communication with field effect transistor 104 causing an output signal to be connected to ground supply. Photodiode 102 and optical transistor 104 can be purchased from Motorola Semiconductor, part number ILD1. Coupled to receive input from pins J1-1, J1-2, J1-7 and J1-8 are non-inverting buffers 106. A suitable buffer can be purchase from Motorola Semiconductor, part number 4050. The output of buffer 106 couples to open collector TTL devices 100 as shown. The following Table I illustrates an exemplary port-to-pin connection for control signals sent therethrough:

TABLE I

| Pin | Port Connection | Control Signal |
| --- | --- | --- |
| J2-3 | PB7 | Gas 2 |
| J2-4 | PB6 | Gas 1 |
| J2-5 | PB5 | Beam On |
| J2-6 | PB4 | Stop Lamp 1 |
| J2-7 | PB3 | A8 Sin |
| J2-8 | PB2 | A7 Sin |
| J2-9 | PB1 | A6 Sin |
| J2-10 | PB0 | A5 Sin |
| J2-28 | PC1 | Load |
| J2-29 | PC0 | Shift |
| J2-32 | PA5 | Spare |
| J2-33 | PA4 | Spare |
| J2-34 | PA3 | Spare |
| J2-35 | PA2 | Reset |
| J2-36 | PA1 | Stop |
| J2-37 | PA0 | Start |

There are numerous control signals which can be sent as Sin control signals from control cards 36. As indicated above, Sin signals are serially input through an input port into computer 38 depending upon user interface protocol. There are also numerous control signals which can be sent as Sout signals to control cards 36. Sout signals can be serially output via an output port from computer 38. The following Table II lists a portion of an exemplary set of control signals which can be sent along Sin and Sout conductive path (or input/output port). The code symbols are exemplary symbols used for an Eaton Corporation, model no. 200 series implanter and commonly described in manuals pertaining to the same. It is understood that any code symbol can be used. The exemplary codes are used simply for ease in understanding the exemplary embodiment described herein. Any of the signal names (control signals) listed below or any other serial input/output control signals can be remotely accessed according to the present invention via computer 38.

TABLE II

| Code | Signal Name |
| --- | --- |
| ACCR | Accelerator Ready |
| AGND | Analog Ground |
| AB | Address Bus |
| ALOG1/2 | Analog 1 or 2 |
| BCA | Beam Control Automatic |
| BMRC | Beam Raise Command |
| BMLC | Beam Lower Command |
| BMLL/RL | Beam Lower Lamp/Beam Raise Lamp |
| BMLLSW/RLSW | Beam Lower Limit Switch/Raise Limit Switch |
| BMRL/LLA | Beam Raise Limit/Lower Limit Acknowledge |
| BMLO/RO | Beam Lower On/Raise On |

TABLE II-continued

| Code | Signal Name |
|---|---|
| BMLOD/ROD | Beam Lower On Drive/Raise On Drive |
| BMO/BMOC | Beam On/Beam On Command |
| BLIOA | Beamline Interlock On Acknowledge |
| BZSL1/2/4/8 | Batch Size Select Lease Significant Digit Bit 1/2/4/8 |
| BZSM1/2/4/8 | Batch Size Select Most Significant Digit Bit 1/2/4/8 |
| BMOE | Beam on Enable |
| BMMAO | Beam MAmp Scale On |
| EXPDP11/12/13 | Exponent Decimal Point 11/12/13 |
| BCDL1/2/4/8 | Beam Current Display Least Significant Digit Bit 1/2/4/8 |
| BCDM1/2/4/8 | Beam Current Display Most Significant Digit Bit 1/2/4/8 |
| BCDN1/2/4/8 | Beam Current Display Next Significant Digit Bit 1/2/4/8 |
| BCINT | Beam Current Interrupt |
| CIA | Chamber Index Acknowledge |
| CHPDC | Chamber Pump Down Command |
| CHPDLO | Chamber Pump Down Lamp On Not |
| CHVD | Chamber Vent Command |
| CHVSLO | Chamber Vent Switch Lamp On Not |
| CRDY | Chamber Ready |
| DP10C/20C/30C | Diffusion Pump One/Two/Three On Command |
| DP3CA/2CA | Diffusion Pump Three/Two Cooling Acknowledge |
| ESO | Electron Suppressor On |
| ESOA | Electron Suppressor On Acknowledge |
| ESOC | Electron Suppressor On Command |
| EROL1/2/4/8 | Energy Read Out Least Significant Digit Bit 1/2/4/8 |
| EROM1/2/4/8 | Energy Read Out Most Significant Digit 1/2/4/8 |
| CRA | Chamber Reset Acknowledge |
| DB0–7 | Data Bus 0–7 |
| DOSXM1/2/4/8 | Dose Exponent Most Significant Digit Bit 1/2/4/8 |
| DOSINT | Dose Interrupt |
| DFLO/A/C | Deflector On/Acknowledge/Command |
| DHVCBMS | Disable HV Control of Beam Shutter |
| DP30A/10A/20A | Diffusion Pump Three/One/Two Acknowledge |
| DPICSW/A | Diffusion Pump One Cooling Switch/Acknowledge |
| DP10/20/30 | Diffusion Pump One/Two/Three On |
| EROM1/2/4/8 | Energy Read Out Most Significant Digit Bit 1/2/4/8 |
| ERON1/2/4/8 | Energy Read Out Next Significant Digit Bit 1/2/4/8 |
| EXPX14/15/16/17 | Exponent Multiplier 14/15/16/17 |
| EXP11/12/13/14 | Exponent 11/12/13/14 |
| EXP15/16/17 | Exponent 15/16/17 |
| FFWC | Frequency Function Wafer Current |
| FOCO/C/A | Focus On/Command/Acknowledge |
| FV30/10 | Foreline Valve Three/One Open |
| FV30A/10A | Foreline Valve Three/One Acknowledge |
| FVAC3A/1A | Foreline Vac 3/1 Acknowledge |
| FV10C | Foreline Valve One On Command |
| FV | Foreline Valve Three On Command |
| HEWFA/S | Heat Exchanger Wafer Flow Acknowledge/Switch |
| HVAV32A/30A/20A/10A | Hi Vac Three and Two Acknowledge/Hi Vac Valve Three/Two/One Open Acknowledge |
| HVV30/20/10 | Hi Vac Valve Three Open/Two Open/One Open |
| HVPSOA | Hi Voltage Power Supply On Acknowledge |
| HVPSO/C | Hi Voltage Power Supply On/Command |
| HVV30C/20C/10C | Hi Vac Valve Three/Two/One Open Command |
| HVAC1A/2A/3A | Hi Vac Valve One/Two/Three Acknowledge |
| HVSETA | Hi Voltage Set Points Acknowledge |
| HVSL1/2/4/8 | Hi Voltage Set Point Least Significant Digit Bit 1/2/4/8 |
| HVSM1/2 | Hi Voltage Set Points Most Significant Digit Bit 1/2 |
| HVSN1/2/4/8 | Hi Voltage Set Point Next Significant Digit Bit 1/2/4/8 |
| HVFBN/P | Hi Voltage Feedback Negative/Positive |
| HVIN/IP | Hi Voltage Current Negative/Positive |
| HVINT | Hi Voltage Interrupt Not |
| HVCVN/P | Hi Voltage Control Voltage Negative/Positive |
| IASTR/P | Integrate Automatic Start/Stop |
| IMSTR | Integrate Manual Start |
| IVOSW/A | Isolation Valve Open Switch/Acknowledge |
| IVO/C | Isolation Valve Open/Command |
| IONL1/2/4/8 | Ions/cm$^2$ Least Significant Digit Bit 1/2/4/8 |
| IONM1/2/4/8 | Ions/cm$^2$ Most Significant Digit Bit 1/2/4/8 |
| IONN1/2/4/8 | Ions/cm$^2$ Next Significant Digit Bit 1/2/4/8 |
| IRA/SA | Integrate Run Acknowledge/Stop Acknowledge |
| LNT30/30C/20C/30A/20A | Liquid Nitrogen Trap Three On/On Command/Trap Two On Command/Trap Three On Acknowledge/Trap Two On Acknowledge |
| LNT30E/20E | Liquid Nitrogen Trap Three/Two On Enable |
| LNT3LS/2LS | Liquid Nitrogen Trap Three/Two Lower Sensor |
| LNT3US/2US | Liquid Nitrogen Trap Three/Two Upper Sensor |
| MP30C/10C | Mechanical Pump Three/One On Command |
| MP30A/10A | Mechanical Pump Three/One On Acknowledge |
| MPXSEL | Multiplex Select |
| N/P15VR | Negative/Positive Fifteen Voltage Regulated |
| NTV | Negative Tracking Voltage |
| PIOA/SW | Personnel Interlock On Acknowledge/Switch |
| P12VU/R | Plus Twelve Volts D.C. Unregulated/Regulated |
| P5VR | Plus Five Voltage D.C. Regulated |
| POC | Power On Clear |
| PTV | Positive Tracking Voltage |
| PVRL1/2/4/8 | Present Value Readout Least Significant Digit Bit 1/2/4/8 |
| PVRM1/2/4/8 | Present Value Readout Most Significant Digit Bit 1/2/4/8 |
| PVRN1/2/4/8 | Present Value Readout Next Significant Digit Bit 1/2/4/8 |
| PVINT/RRST | Present Value Interrupt/Readout Reset |
| PWDL1/2/4/8 | Present Wafer Display Least Significant Digit Bit 1/2/4/8 |
| PWDM1/2/4/8 | Present Wafer Display Most Significant Digit Bit 1/2/4/8 |
| PRINTA | Print A |
| RVAC1A/3A | Roughing Vac One/Three Acknowledge |
| RV30 | Roughing Valve Three Open |

Figure 8:
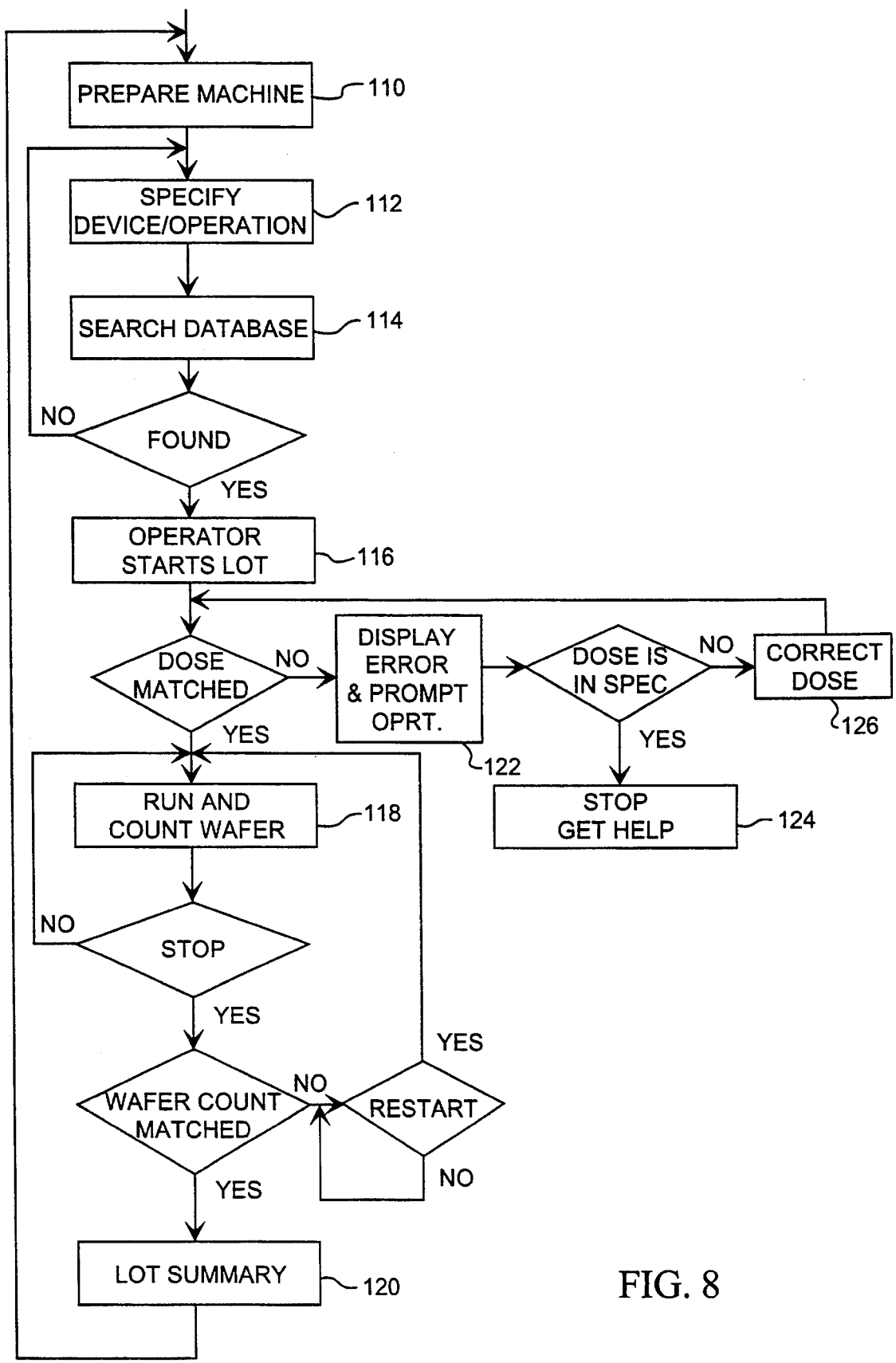
FIG. 8 is a flow diagram of one mode of operation of an ion implanter and remote computer interface according to the present invention.

Referring now to FIG. 8, a flow diagram of the operation of the implanter and remote computer interface is illustrated. Implantation begins by an operator preparing the machine to receive wafers as illustrated in block 110. After the machine is prepared, the operator specifies implant parameters and/or device operation for machine 30 as shown by block 112. In order to specify implant parameters, computer 38 database or harddrive is searched for control signals having those parameters 114. If the search is successful, then the operator starts processing the wafer lot 116. If unsuccessful, the operator is prompted to re-enter or re-specify implant parameters. The operator can start wafer lot processing by pressing, for example, a function key on computer 38 to send a start control signal to machine 30 to initiate dosimetry. If the dose sent to machine 30 matches the dose recalled from harddrive, then the wafer is exited from load station 32. As the wafer is processed, a count is obtained, 118, regarding the wafer number and wafer lot tracking number, and if the operator desires the machine to stop, then the wafer count is matched against that being performed in order to present a lot summary 120. If the wafer count does not match, then the count is rerun until a match is obtained or until a error is signified on the CRT display. The counting and lot summary of each wafer/lot is repeated for all subsequent wafers to achieve complete processing of the lot. If, however, a dose does not match, then a display error is sent to the CRT to prompt the operator, 122, to investigate whether or not the dose is within specification. If the dose is within specification but does not match, then machine operation is stopped 124 by the computer indicating possible computer error and signaling the need for operator assistance. If the dose is not within specification thereby verifying the dose does not match, then the correct dose is entered by the operator on the computer 126 and dose inquiry is repeated until the dose does match and wafer count 118 begins.

It will be appreciated to those skilled in the art having the benefit of this disclosure that this invention is believed to be capable of applications with numerous types of ion implanters. The implanter described herein is to be retrofitted at the implanter control cards with a computer interface network placed between the computer and the cards. The interface network includes opto-isolator card 40, vector card 42 and DIO card 44. All that is required of control card 36 is for it to serially input control signals on a plurality of conductors and to serially output control signals from those conductors. There can be one, two or numerous control cards which achieve that function. Moreover, various components configured upon the control card and interface network can be modified and reconfigured without departing from the spirit and scope of the invention as set forth in the claims. An exemplary modification might be one which achieves gas 1 and gas 2 signals without requiring nand gate logic or which uses other logic instead of operational amplifiers, inverters and comparators. Still further, resistive values shown in the drawings can change depending upon the magnitude or delay associated with each control signal. Even still further, the locations of input and output ports PA, PB and PC can be modified depending upon the control byte sent to the programmable peripheral interface. Accordingly, various control bytes can be used to reconfigure the input/output port position and therefore allowing pins J2-1 through J2-37 to be rearranged. It is intended that the following claims be interpreted to embrace all such modifications and changes.

What is claimed is:

1. An apparatus for monitoring and controlling an ion implant device, comprising:

a plurality of control signals sent between an ion implant device and a user control panel;

a control card connected within said ion implant device and adapted to receive said control signals, wherein said control signals comprise signals for automatically tracking wafers and wafer lot numbers processed by said ion implant device and for correlating wafer processing skews and the effect of said skews upon wafer yield;

an interface network connected to said control card for level shifting and serially accessing said control signals; and a computer placed in a room remote and separate from said ion implant device and retrofitted to electrically interface with said control card by coupling said interface network between said computer and said control card, said computer is adapted to read, store and write the serially accessed said control signals to and from the control card over a telephone line using an RS232 port.

2. An apparatus for monitoring and controlling an ion implant device, comprising:

a plurality of control signals sent between an ion implant device and a user control panel;

a control card connected within said ion implant device and adapted to receive said control signals;

an interface network connected to said control card for level shifting and serially accessing said control signals, wherein said interface network comprises:

a vector card connected to said ion implant device and adapted to receive said control signals from said user control panel, wherein said vector card comprises three subcircuits connected together at pin locations within a socket connector, said first subcircuit includes a comparator, a pair of inverters and a bipolar transistor connected together for converting an analog stop lamp signal originated at said user control panel to a digital representation of said stop lamp signal, said second subcircuit includes a gas select switch, an operational amplifier, three parallel-connected comparators and an inverter nand gate logic circuitry connected together for producing a binary representation of four possible digital signals used for selecting the type of gas used within said ion implant device, said third subcircuit includes a switch and a pull-up resistor connected together such that closure of said switch will effectuate a binary value representing 0° tilt angle of a platform on which a wafer resides within said ion implant device, and an open switch will effectuate a binary value representing 7° tilt angle of said platform;

an opto-isolator card connected to said implant device and adapted to receive said control signals from said control card and said vector card, said opto-isolator card comprises a plurality of open-drain bipolar transistors optically connected to a plurality of photosensitive diodes; and a computer placed in a room remote and separate from said ion implant device and retrofitted to electrically interface with said control card by coupling said interface network between said computer and said control card, said computer is adapted to read, store and write the serially accessed said control signals to and from the control card over a telephone line using an RS232 port.

3. An apparatus for writing control signals from an ion implant device to a computer, comprising:

a plurality of control signals sent between an ion implant device and a user control panel configured upon said implant device, wherein said control signals comprise beam current, ion implant dose, ion source energy, wafer tracking number, ion beam on, automatic beam control on, ion implant chamber ready, cooling system on, ion implant start, ion implant stop and gas type signals;

a control card connected within said ion implant device and adapted to receive said control signals in parallel and deliver in series said control signals to an input port, wherein said control card comprises a plurality of shift registers having inputs connected in parallel and outputs connected in series for delivering serially shifted said control signals to said input port;

an interface network connected between said user control panel and said control card to receive said control signals from said user control panel and from said input port, said interface network comprising:

a vector control card connected to said ion implant device and adapted to receive the first set of said control signals from said user control panel, wherein said vector card comprises three subcircuits connected together at pin locations within a socket connector, said first subcircuit includes a comparator, a pair of inverters and a bipolar transistor connected together for converting an analog stop lamp signal originated at said user control panel to a digital representation of said stop lamp signal, said second subcircuit includes a gas select switch, an operational amplifier, three parallel-connected comparators and an inverter nand gate logic circuitry connected together for producing a binary representation of four possible digital signals used for selecting the type of gas used within said ion implant device, said third subcircuit includes a switch and a pull-up resistor connected together such that closure of said switch will effectuate a binary value representing 0° tilt angle of a platform on which a wafer resides within said ion implant device, and an open switch will effectuate a binary value representing 7° tilt angle of said platform;

an opto-isolator card connected to said ion implant device and adapted to receive the second set of said control signals from said control card, said opto-isolator card comprises a plurality of open-drain bipolar transistors optically connected to a plurality of photosensitive diodes; and a computer placed in a room remote and separate from said ion implant device, said computer having a storage media capable of writing said control signals upon address lines connected from said input port to said computer, said storage media comprises a set of addressable instructions responsive to said control signals.

4. The apparatus as recited in claim 3, wherein said control signals comprises signals for automatically tracking wafers and wafer lot numbers processed by said ion implant device and for correlating wafer processing skews and the effect of said skews upon wafer yield.

5. The apparatus as recited in claim 3, wherein said control signals comprise signals for indicating ion beam on, automatic beam control on, ion implant chamber ready and cooling system on.

6. The apparatus as recited in claim 3, wherein said control signals comprise signals manually sent from the user control panel indicating ion implant start, ion implant stop and ion gas type.

* * * * *